(12) United States Patent
Keller et al.

(10) Patent No.: US 7,111,215 B1
(45) Date of Patent: Sep. 19, 2006

(54) METHODS OF REDUCING THE SUSCEPTIBILITY OF PLD DESIGNS TO SINGLE EVENT UPSETS

(75) Inventors: Eric R. Keller, Boulder, CO (US); Prasanna Sundararajan, Mountain View, CA (US); Stephen M. Trimberger, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 430 days.

(21) Appl. No.: 10/768,304

(22) Filed: Jan. 29, 2004

Related U.S. Application Data

(63) Continuation-in-part of application No. 10/603,734, filed on Jun. 24, 2003.

(51) Int. Cl.
*G01R 31/28* (2006.01)

(52) U.S. Cl. .......................... 714/725; 326/38
(58) Field of Classification Search ................ 257/530; 327/408; 365/154; 326/10, 38; 714/725
See application file for complete search history.

(56) References Cited

U.S. PATENT DOCUMENTS

| | | | | |
|---|---|---|---|---|
| 5,925,920 | A * | 7/1999 | MacArthur et al. | 257/530 |
| 6,505,337 | B1 | 1/2003 | Wittig et al. | |
| 6,617,912 | B1 * | 9/2003 | Bauer | 327/408 |
| 6,621,296 | B1 | 9/2003 | Carberry et al. | |
| 6,621,298 | B1 | 9/2003 | Agrawal et al. | |
| 6,671,202 | B1 * | 12/2003 | Bauer | 365/154 |
| 6,903,571 | B1 * | 6/2005 | Trimberger | 326/38 |
| 7,023,235 | B1 * | 4/2006 | Hoff | 326/10 |

OTHER PUBLICATIONS

U.S. Appl. No. 09/783,821, filed Feb. 14, 2001, Carmichael et al.
Phil Brinkley, Carl Carmichael; XAPP181 (v1.0); "SEU Mitigation Design Techniques for the XQR4000XL"; Mar. 15, 2000; available from Xilinx, Inc., 2100 Logic Drive, San Jose, CA 95124 or http//www.xilinx.com.; pp. 1-14.

* cited by examiner

*Primary Examiner*—David Ton
(74) *Attorney, Agent, or Firm*—Lois D. Cartier

(57) ABSTRACT

Methods of implementing designs in programmable logic devices (PLDs) to reduce susceptibility to single-event upsets (SEUs) by taking advantage of the fact that most PLD designs leave many routing resources unused. The unused routing resources can be used to provide duplicate routing paths between source and destination of signals in the design. The duplicate paths are selected such that an SEU affecting one of the duplicate paths simply switches the signal between the two paths. Thus, if one path is disabled due to an SEU, the other path can still provide the necessary connection, and the functionality of the design is unaffected. The methods can be applied, for example, to routing software for field programmable gate arrays (FPGAs) having programmable routing multiplexers controlled by static RAM-based configuration memory cells.

64 Claims, 12 Drawing Sheets

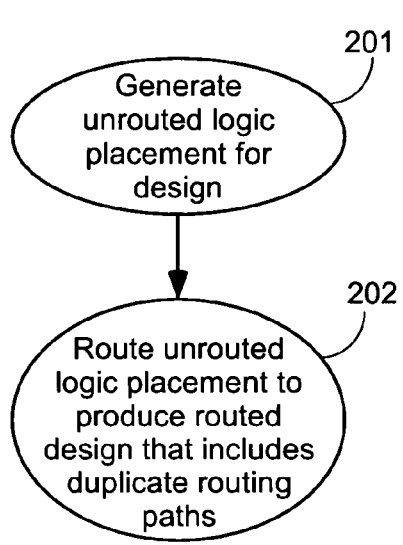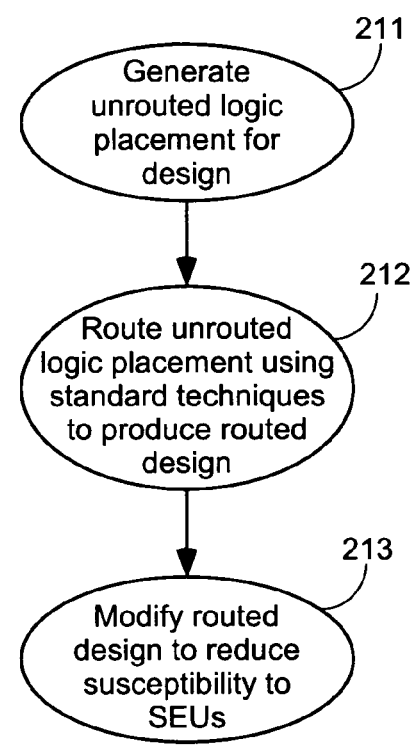
FIG. 2A
FIG. 2B

US 7,111,215 B1

METHODS OF REDUCING THE SUSCEPTIBILITY OF PLD DESIGNS TO SINGLE EVENT UPSETS

FIELD OF THE INVENTION

The invention relates to programmable logic devices (PLDS) subject to single event upsets (SEUS). More particularly, the invention relates to methods of using redundant routing resources to minimize the susceptibility to SEUs of a design implemented in a PLD.

BACKGROUND OF THE INVENTION

Programmable logic devices (PLDS) are a well-known type of digital integrated circuit that can be programmed to perform specified logic functions. For example, one type of PLD, the field programmable gate array (FPGA), typically includes an array of configurable logic blocks (CLBs) surrounded by a ring of programmable input/output blocks (IOBs). Some FPGAs also include additional logic blocks with special purposes (e.g., DLLs, RAMs, processors, and so forth).

FPGA logic blocks typically include programmable logic elements such as lookup tables (LUTs), memory elements, multiplexers, and so forth. The LUTs are typically implemented as RAM arrays in which values are stored during "configuration" (i.e., programming) of the FPGA. The flip-flops, multiplexers, and other components are also programmed by writing configuration data to configuration memory cells included in the logic block. For example, the configuration data bits can enable or disable elements, alter the aspect ratios of memory arrays, select latch or flip-flop functionality for a memory element, and so forth. The configuration data bits can also interconnect the logic elements in various ways within a logic block by programming select values for multiplexers inserted in the interconnect paths within the logic block.

The various logic blocks are interconnected by a programmable interconnect structure that includes a large number of programmable interconnect lines (e.g., metal traces). The interconnect lines and logic blocks are interconnected using programmable interconnect points (PIPs). For example, a PIP can be implemented as a simple CMOS passgate. When the passgate is turned on, the two interconnect lines on either side of the passgate are electrically connected. When the passgate is turned off, the two interconnect lines are isolated from each other. Thus, by controlling the values on the gate terminals of the passgates, circuit connections can be easily made and altered. The value controlling each passgate is also stored in a configuration memory cell.

FIG. 1 shows an exemplary implementation of a routing path between a source logic block (LB) 101 and a destination logic block 102. In the PLD of FIG. 1, each interconnect line (103–107) is driven by an associated programmable routing multiplexer (113–117, respectively). In some PLDS, interconnect line 103 is driven by a driver or multiplexer included in source logic block 101, i.e., multiplexer 113 is omitted. The path between the source 101 and destination 102 logic blocks traverses multiplexer 113, interconnect line 103, multiplexer 114, interconnect line 104, multiplexer 115, interconnect line 105, multiplexer 116, interconnect line 106, multiplexer 117, and interconnect line 107.

FIG. 1A shows one possible implementation of routing multiplexer 116 of FIG. 1, in which routing multiplexer 116 includes a 4-input multiplexer 121 controlled by two configuration memory cells MC1 and MC0. The values stored in configuration memory cells MC1 and MC0 select one of the input signals IN0–IN3 to be passed to the output node OUT. (In the present specification, the same reference characters are used to refer to terminals, interconnect lines, nodes, and their corresponding signals.) In the pictured example, input terminal IN1 of multiplexer 121 is coupled to interconnect line 105 of FIG. 1. The other input terminals IN0, IN2, IN3 are coupled to other interconnect lines (not shown). Configuration memory cells MC1 and MC0 store low and high values, respectively, selecting the signal on interconnect line 105 to be passed to the output node OUT through input terminal IN1. The output node OUT is coupled to interconnect line 106 of FIG. 1.

Routing multiplexers typically include more than four input signals, but four input signals are shown in FIG. 1A, for clarity. The number of configuration memory cells controlling the multiplexer depends at least in part on the number of input signals to the multiplexer.

In FPGAs, configuration memory cells are typically implemented as static RAM (random access memory) cells. Each FPGA typically contains many thousands or even millions of these static RAM configuration memory cells.

When bombarded by high-energy particles, a static RAM cell can change state. For example, a stored high value can be inadvertently changed to a low value, and vice versa. These inadvertent and undesired state changes are known as "single event upsets", or SEUs. Sometimes an SEU has no effect on the functionality of the design. At other times, an SEU can change the function of an FPGA such that the circuit implemented in the FPGA no longer functions properly.

For example, if a static RAM cell controlling a passgate changes state, but the two interconnect lines on either side of the passgate are not used in the design, this change of state has no effect on the function of the circuit. Similarly, a change of state in a memory cell in an unused LUT has no effect. However, when SEUs occur in portions of the FPGA that are in use, the SEUs can result in loss of function for the design implemented in the FPGA.

In some applications, such as space-based applications in a low-earth orbit, it is important to minimize the effects of SEUs in PLD-based (e.g., FPGA-based) designs. SEUs can also be a concern in some earth-based systems, e.g., systems in high altitude locations. One method of mitigating and minimizing these effects is "triple modular redundancy", or TMR, in which three copies of a circuit are included in a design. Any two copies of the circuit can override output from the third copy, if it generates data different from the other copies. While useful in many applications, implementing a circuit using TMR requires about three times as many programmable resources as a standard implementation.

Therefore, it is desirable to provide methods other than TMR that will reduce the susceptibility to SEUs of a PLD design.

SUMMARY OF THE INVENTION

The invention provides methods of implementing designs in programmable logic devices (PLDs) to reduce susceptibility to single-event upsets (SEUs). The methods of the invention take advantage of the fact that most PLD designs leave many routing resources unused. The unused routing resources can be used to provide duplicate paths between source and destination of signal paths in the design. The duplicate paths are selected such that an SEU affecting one of the duplicate paths simply switches the signal between the two paths. Thus, if one path is disabled due to an SEU, the other path can still provide the necessary connection, and the functionality of the design is unaffected. The methods of the invention can be applied, for example, to routing software for field programmable gate arrays (FPGAs) controlled by static RAM-based configuration memory cells.

In some embodiments, the duplicate paths are provided during the routing phase of the place-and-route implementation of the PLD design. In other embodiments, a post-processing step performed on a previously placed and routed PLD design adds additional paths to reduce the susceptibility of the design to SEUs.

In some embodiments, each of the duplicate paths traverses a routing multiplexer that can optionally select either of the duplicate paths. The input terminals used by the duplicate paths are selected such that an SEU affecting input selection for the programmable routing multiplexer simply changes the input selection from one to the other of the duplicate paths.

In some embodiments, three duplicate paths are provided for a node. Destination logic for the node is implemented using triple modular redundancy (TMR), e.g., in a look-up table (LUT) of an FPGA. All three paths are provided to the LUT, each providing a TMR input. Therefore, if one of the paths is subject to an SEU, the other two paths (which are unaffected) ensure that the correct signal value is utilized in the destination logic.

In some embodiments, two duplicate paths are provided, one of which traverses a transparent latch, and the other of which bypasses the transparent latch. For example, many FPGAs include programmable memory elements that can be configured as both flip-flops and transparent latches. If the memory element is otherwise unused by the design implementation, a signal can both traverse and bypass such an element without affecting resource utilization for the rest of the design.

BRIEF DESCRIPTION OF THE DRAWINGS

The present invention is illustrated by way of example, and not by way of limitation, in the following figures.

FIG. 2A shows the steps of a first method of reducing the susceptibility to SEUS of a design implemented in a PLD, according to an embodiment of the invention.

FIG. 2B shows the steps of a second method of reducing the susceptibility to SEUs of a design implemented in a PLD, according to another embodiment of the invention.

DETAILED DESCRIPTION OF THE DRAWINGS

Figure 1:
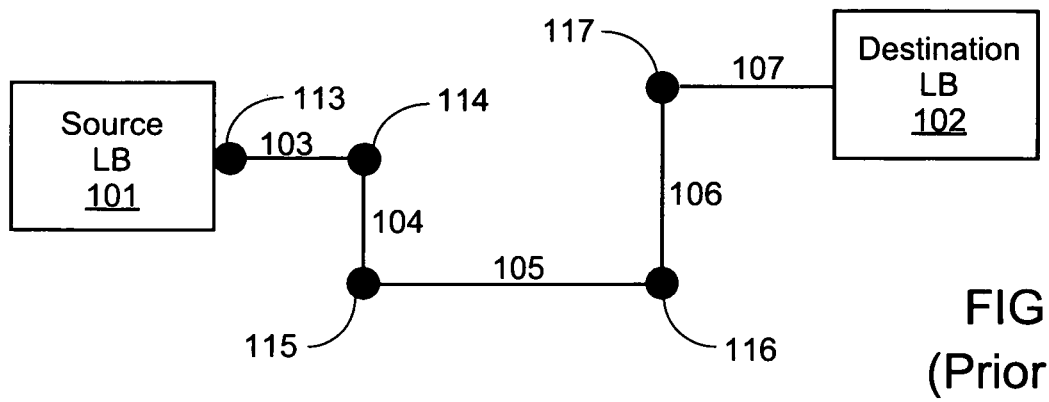
FIG. 1 shows an exemplary routing path between a source logic block and a destination logic block in a PLD design generated using known methods.

The present invention is believed to be applicable to a variety of programmable logic devices (PLDs). The methods of the invention have been found to be particularly applicable and beneficial for designs implemented using field programmable gate arrays (FPGAS) controlled by static RAM-based configuration memory cells. However, the methods of the invention are not so limited, and can be applied to any PLD subject to single event upsets.

The implementation of a design in a PLD typically includes two phases. In the "placement" phase, the design is divided into sub-circuits, where each sub-circuit is sized to fit into one of the available programmable logic blocks (or into a portion of one of the available blocks). This step is known as "mapping". Each sub-circuit is then assigned to one of the programmable logic blocks in the PLD. The result of this process is a PLD placement that includes the logic in the design but does not include the interconnections between logic in different logic blocks. In the "routing" phase, the nodes (nets) interconnecting the various logic blocks are added to the design. Once the design has been fully implemented, e.g., placed and routed in the PLD, a configuration data file is generated from the placed and routed design. The configuration data file will implement the design when loaded into the PLD.

According to one aspect of the present invention, the routing software for the PLD can be designed to implement more than one routing path for one or more of the nodes in the design. The duplicate paths are selected such that an SEU affecting one of the duplicate paths simply switches the signal between the two paths. Thus, if one path is disabled due to an SEU, the other path can still provide the necessary connection, and the functionality of the design is unaffected.

FIG. 2A illustrates a method according to this aspect of the invention. In step 201, an unrouted logic placement is generated for a design (the "placement" phase). The design includes source logic, destination logic, and a node coupled between the source logic and the destination logic. In step 202, the unrouted logic placement is routed and a routed design is produced (the "routing" phase). The routed design includes duplicate routing paths for the node. The terms "duplicate routing paths" and "duplicate paths" refer to two or more signal path implementations for the same node, where at least part of the node is routed more than once. Clearly, the duplicate paths are duplicates in a logical sense, but are not exact physical duplicates of one another, e.g., they can have different shapes and physical implementations, and can traverse different numbers and types of routing resources.

According to another aspect of the invention, a post-processing step can be added after the routing phase of the PLD implementation process. Thus, standard placement and routing software can be used to generate a placed and routed design, and the post-processing software can add additional routing paths, optionally modifying the existing routing path for the node as well. The duplicate routing paths are selected such that an SEU affecting one of the duplicate paths simply switches the signal between the two paths.

FIG. 2B illustrates a method according to this aspect of the invention. In step 211, an unrouted logic placement is generated for a design. The design includes source logic, destination logic, and a node coupled between the source logic and the destination logic. In step 212, the unrouted logic placement is routed, e.g., using standard routing techniques, and a routed design is produced. In step 213, the routed design is modified, e.g., by adding duplicate routing paths, to reduce the susceptibility of the design to SEUs.

Figure 3:
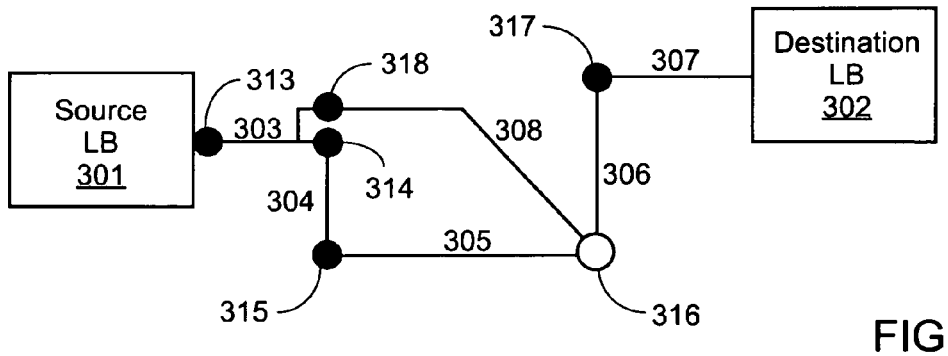
FIG. 3 shows exemplary routing paths implemented in a PLD according to an embodiment of the present invention.

FIG. 3 shows an exemplary implementation of two routing paths between a source logic block (LB) 301 and a destination logic block 302, implemented according to one embodiment of the invention. In the PLD of FIG. 3, each interconnect line (303–307) is driven by an associated programmable routing multiplexer (313–317, respectively). In some PLDS, interconnect line 303 is driven by a driver or multiplexer included in source logic block 301, i.e., multiplexer 313 is omitted.

A first routing path between the source 301 and destination 302 logic blocks traverses multiplexer 313, interconnect line 303, multiplexer 314, interconnect line 304, multiplexer 315, interconnect line 305, multiplexer 316, interconnect line 306, multiplexer 317, and interconnect line 307. A second routing path between the source 301 and destination 302 logic blocks traverses multiplexer 313, interconnect line 303, multiplexer 318, interconnect line 308, multiplexer 316, interconnect line 306, multiplexer 317, and interconnect line 307.

The two routing paths between the source and destination logic blocks are not randomly selected, nor are they selected simply to minimize the distance traveled or the delay on the node. Instead, the routing paths are selected in a fashion designed to reduce the susceptibility of the design to SEUs. However, given this constraint, due consideration can also be given to other factors such as distance and delay, if desired. For example, in an FPGA there are often many different equivalent routes, i.e., interconnect lines having the same length and the same delay. For example, routing software can be programmed to preferentially use similar types of interconnect lines when implementing redundant routing, such that predefined timing constraints are still met. As another option, the software can be designed to omit redundant routing whenever the addition of the redundant routing prevents meeting the imposed timing constraints.

Figure 4:
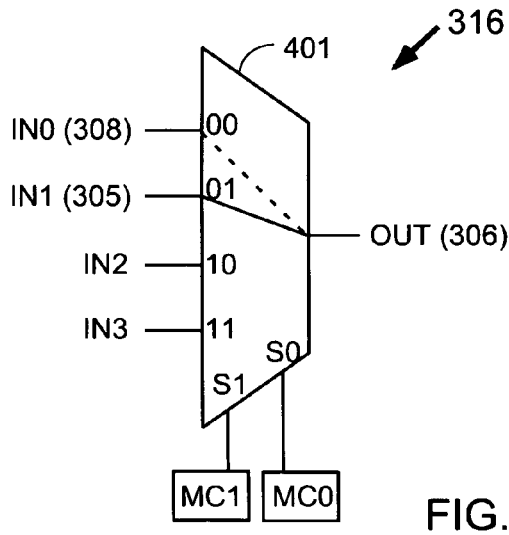
FIG. 4 shows one implementation of a 4-input multiplexer that can be used, for example, in the routing paths of FIG. 3.

FIG. 4 illustrates an exemplary way in which a design can be made less susceptible to SEUs. FIG. 4 shows one possible implementation of multiplexer 316 of FIG. 3, in which routing multiplexer 316 includes a 4-input multiplexer 401 controlled by two configuration memory cells MC1 and MC0. The values stored in configuration memory cells MC1 and MC0 select one of the input signals IN0–IN3 to drive the output node OUT, which is coupled in this example to interconnect line 306 of FIG. 3. In the pictured example, input terminal IN1 of multiplexer 401 is coupled to interconnect line 305, and input terminal IN0 is coupled to interconnect line 308. Configuration memory cells MC1 and MC0 store low and high values, respectively, selecting interconnect line 305 to drive output signal OUT.

Note that if an SEU were to affect memory cell MC0, the values stored in memory cells MC1 and MC0 would both be low. In that event, multiplexer 401 would select interconnect line 308 from input terminal IN0 to drive interconnect line 306. However, the same signal (from interconnect line 303) is supplied to each of interconnect lines 305 and 308. Thus, this SEU would not cause any change to the logical functionality of the circuit, although the signal delay might or might not change.

Routing multiplexers typically include more than four input signals, but four input signals are shown in FIG. 4, for clarity. The number of configuration memory cells in the routing multiplexer depends at least in part on the number of input signals to the multiplexer.

Figure 1A:
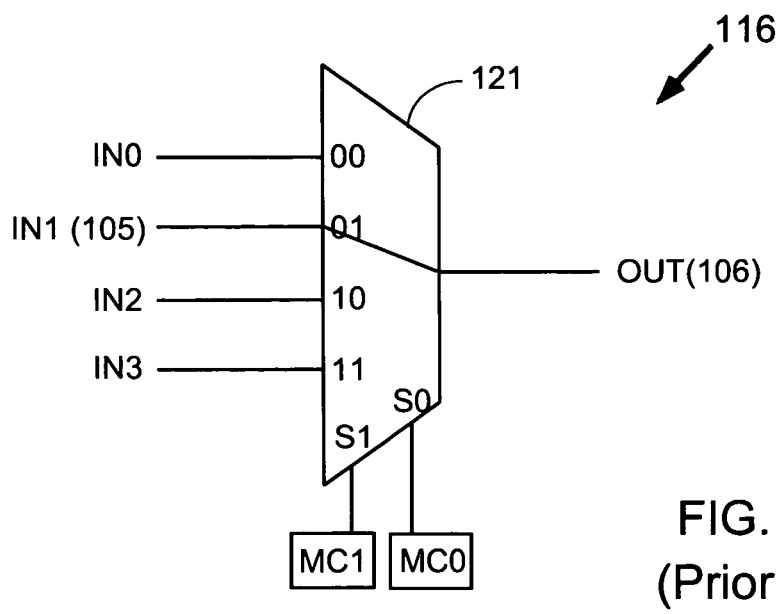
FIG. 1A shows a 4-input routing multiplexer that can be used, for example, in the routing path of FIG. 1.

The multiplexer configuration shown in FIG. 4 is immune to the effects of an SEU occurring in memory cell MC0. However, an SEU occurring in memory cell MC1 would cause the IN3 input terminal of multiplexer 401 to be selected (the values stored in memory cells MC1 and MC0 would both be high). Therefore, the multiplexer configuration shown in FIG. 4, while less susceptible than multiplexer 116 of FIG. 1A, is still susceptible to SEUS.

Figure 5:
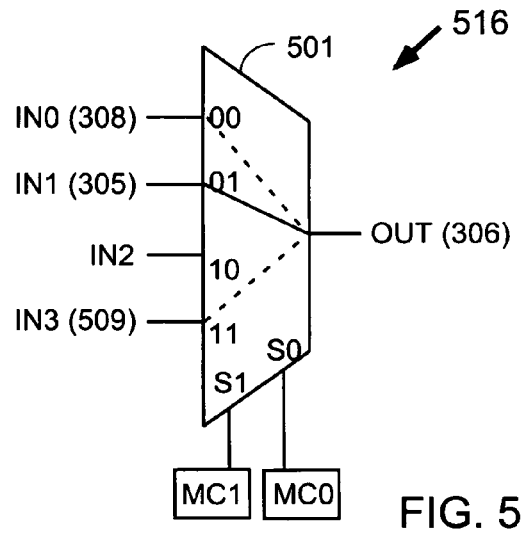
FIG. 5 shows one implementation of a 4-input multiplexer that can be used, for example, in the routing paths of FIG. 6.

FIG. 5 addresses this issue by providing a multiplexer configuration immune to SEUs in either memory cell. In the multiplexer configuration of FIG. 5, routing multiplexer 516 includes a 4-input multiplexer 501 controlled by two configuration memory cells MC1 and MC0. The values stored in configuration memory cells MC1 and MC0 select one of the input signals IN0–IN3 to drive the output node OUT, which is coupled in this example to interconnect line 306 (see FIG. 6). In the pictured example, input terminal IN1 of multiplexer 501 is coupled to interconnect line 305, input terminal IN0 is coupled to interconnect line 308, and input terminal IN3 is coupled to interconnect line 509 (see FIG. 6). Configuration memory cells MC1 and MC0 store low and high values, respectively, selecting interconnect line 305 to drive output signal OUT.

Figure 6:
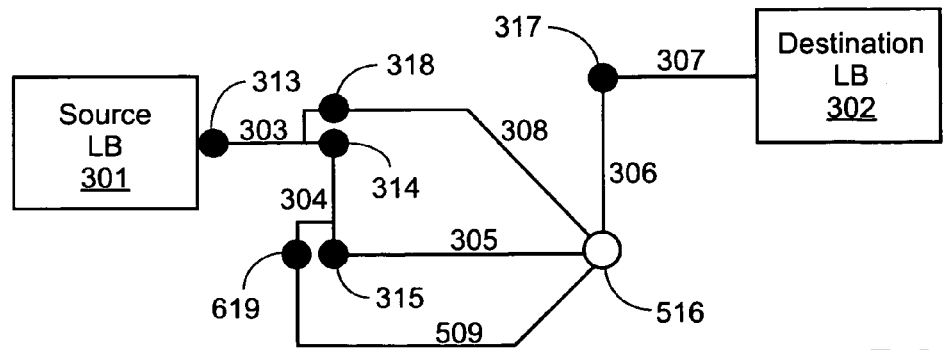
FIG. 6 shows exemplary routing paths implemented in a PLD according to another embodiment of the present invention.

FIG. 6 shows exemplary routing paths in which the multiplexer configuration of FIG. 5 can be applied with the desired result. The routing paths shown in FIG. 6 are similar to those shown in FIG. 3, but with the addition of routing multiplexer 619 and interconnect line 509. Routing multiplexer 516 can be implemented, for example, as shown in FIG. 5.

Returning to FIG. 5, as in the multiplexer configuration shown in FIG. 4, if an SEU were to affect memory cell MC0, the values stored in memory cells MC1 and MC0 would both be low. In that event, multiplexer 501 would be selecting interconnect line 308 to drive interconnect line 306. However, the same signal (from interconnect line 303) is supplied to each of interconnect lines 305 and 308. Thus, this SEU would not affect the logical functionality of the circuit, although the signal delay might or might not change.

Unlike the multiplexer configuration shown in FIG. 4, an SEU affecting memory cell MC1 is also addressed in FIGS. 5 and 6. If an SEU were to affect memory cell MC1, the values stored in memory cells MC1 and MC0 would both be high. In that event, multiplexer 501 would select interconnect line 509 to drive interconnect line 306. Therefore, if the same signal is supplied to each of interconnect lines 305, 308, and 509, this SEU also would not affect the logical functionality of the circuit.

Many other implementations are also possible for routing multiplexer 516. For example, when routing multiplexer 516 is a 4-input multiplexer controlled by two memory cells as shown in FIG. 5, the possible choices for the input terminals to be coupled together are as shown in Table 1. The first column in Table 1 shows the values initially selected for memory cells MC1, MC0. The second column shows which input terminal is selected by the initial values. The third column shows the input terminal that would be selected in the event of an SEU affecting memory cell MC1. The fourth column shows the input terminal that would be selected in the event of an SEU affecting memory cell MC0.

TABLE 1

| MC1, MC0 | Selected InX | SEU in MC1 | SEU in MC0 |
| --- | --- | --- | --- |
| 0, 0 | IN0 | IN2 | IN1 |
| 0, 1 | IN1 | IN3 | IN0 |
| 1, 0 | IN2 | IN0 | IN3 |
| 1, 1 | IN3 | IN1 | IN2 |

As can be seen from Table 1, when input terminal IN0 is initially selected, the effects of SEUs in the two memory cells can be cut in half by providing the IN0 input signal to either of input terminals IN2 and IN1, or removed altogether by providing the IN0 input signal to both IN2 and IN1. Similarly, when input terminal IN1 is initially selected, the effects of SEUS in the two memory cells can be cut in half by providing the IN1 input signal to either of input terminals IN3 and IN0, or removed altogether by providing the IN1 input signal to both IN3 and IN0. When input terminal IN2 is initially selected, the effects of SEUs in the two memory cells can be cut in half by providing the IN2 input signal to either of input terminals IN0 and IN3, or removed altogether by providing the IN2 input signal to both IN0 and IN3. When input terminal IN3 is initially selected, the effects of SEUs in the two memory cells can be cut in half by providing the IN3 input signal to either of input terminals IN1 and IN2, or removed altogether by providing the IN3 input signal to both IN1 and IN2.

The methods of the invention can also be applied to routing multiplexers having fewer than four input terminals, or more than four input terminals. For example, when the routing multiplexer is a 2-input multiplexer controlled by a single memory cell, routing a node to both input terminals of the multiplexer protects against SEUs regardless of which input terminal is initially selected.

Table 2 shows the possible choices for the input terminals when an exemplary 8-input routing multiplexer controlled by 3 memory cells is used. The first column in Table 2 shows the values initially selected for memory cells MC2, MC1, MC0. The second column shows which input terminal is selected by the initial values. The third column shows the input terminal that would be selected in the event of an SEU affecting memory cell MC2. The fourth column shows the input terminal that would be selected in the event of an SEU affecting memory cell MC1. The fifth column shows the input terminal that would be selected in the event of an SEU affecting memory cell MC0.

TABLE 2

| MC2, MC1, MC0 | Selected InX | SEU in MC2 | SEU in MC1 | SEU in MC0 |
| --- | --- | --- | --- | --- |
| 0, 0, 0 | IN0 | IN4 | IN2 | IN1 |
| 0, 0, 1 | IN1 | IN5 | IN3 | IN0 |
| 0, 1, 0 | IN2 | IN6 | IN0 | IN3 |
| 0, 1, 1 | IN3 | IN7 | IN1 | IN2 |
| 1, 0, 0 | IN4 | IN0 | IN6 | IN5 |
| 1, 0, 1 | IN5 | IN1 | IN7 | IN4 |
| 1, 1, 0 | IN6 | IN2 | IN4 | IN7 |
| 1, 1, 1 | IN7 | IN3 | IN5 | IN6 |

In some PLD architectures, the particular input terminals of a multiplexer that are used to route the input signals can be selected to maximize a number of duplicate paths differing by a single select bit. For example, some PLD architectures include multiplexers having shared input terminals, but separate select lines and output terminals. For two 8-input multiplexers, the (0,0,0) input terminals are coupled together, (the 0,0,1) input terminals are coupled together, and so forth. Each 8-input multiplexer includes three configuration memory cells selecting a different one of two input signals. If, for example, the input signals are initially routed on terminals (0,0,0) and (1,1,1), the full benefit of the invention can be realized. The first input signal can be routed to input terminals (0,0,0), (0,0,1), (0,1,0), and (1,0,0) of both multiplexers. The second input signal can be routed to input terminals (1,1,1), (1,1,0), (1,0,1), and (0,1,1) of both multiplexers. Thus, the signals on terminals (0,0,0) and (1,1,1) are each immune to an SEU occurring on any of the six memory cells controlling the two multiplexers. Some other sets of input signals can confer the same benefits. These sets can be derived by those of skill in the relevant arts.

Tables 1 and 2 can easily be adapted by those of skill in the art to provide tables for multiplexers having different numbers of input terminals, and for multiplexers using different decoding schemes. The methods of the invention can be applied to any multiplexer where two input terminals can be identified such that a selection is made between the two data input terminals based on the status of a single memory cell. Based on the disclosure herein, it would be clear to those of skill in the art how to make such an identification, and how to route a node to each of the data input terminals of the multiplexer. Therefore, the invention is not limited by the exemplary multiplexers described herein.

Figure 7:
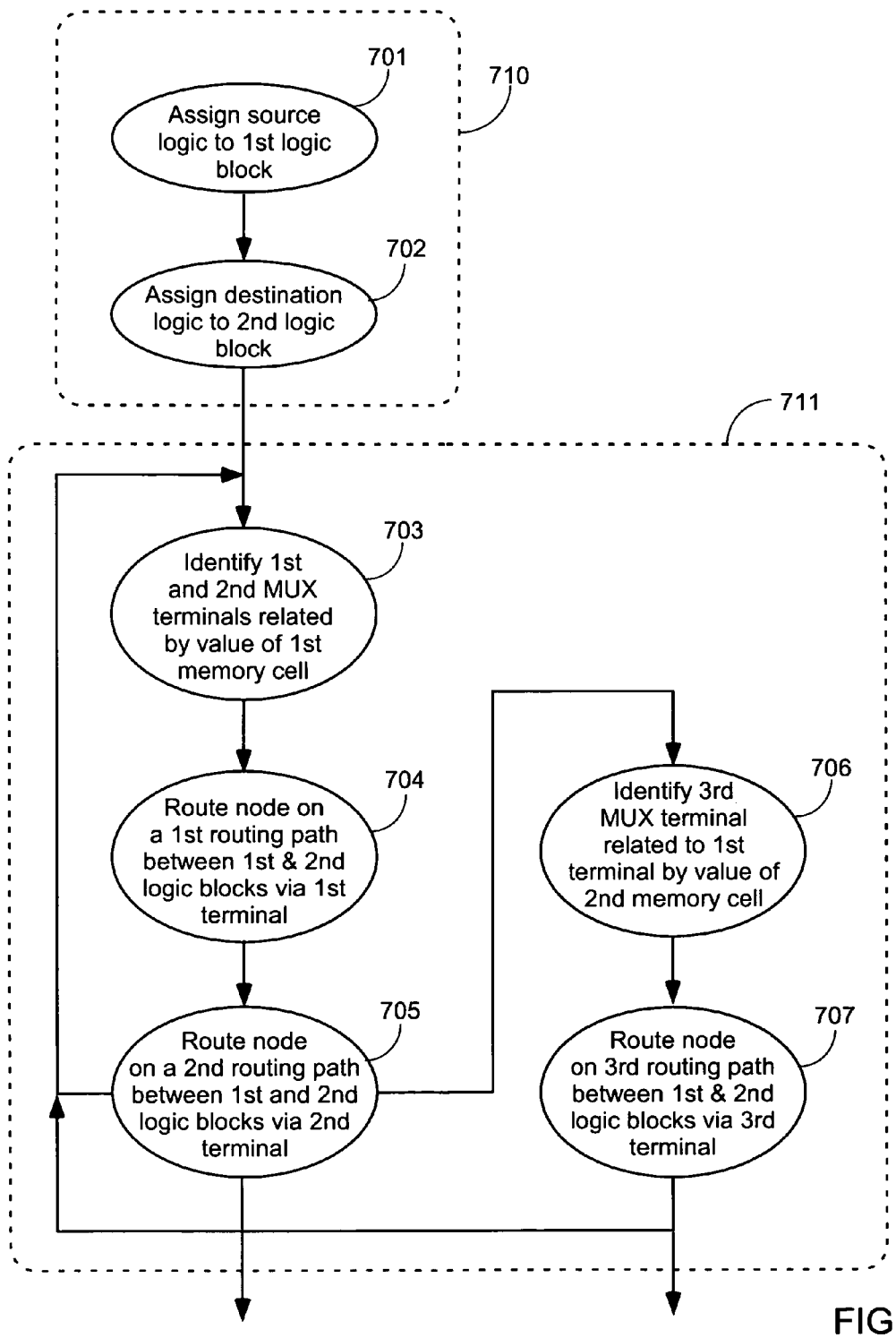
FIG. 7 shows the steps of a first method of implementing a design in a PLD to reduce susceptibility to SEUs, utilizing duplicate paths through a routing multiplexer.

FIG. 7 shows the steps of a first method of implementing a design in a PLD to reduce susceptibility to SEUs, utilizing duplicate paths through a routing multiplexer. This method can be enabled, for example, by altering existing PLD routing software to add the required new capabilities. The design includes source logic, destination logic, and a node coupled between the source logic and the destination logic.

In step 701, the source logic is assigned to a first logic block in the PLD, and in step 702, the destination logic is assigned to a second logic block in the PLD. Steps 701 and 702 can be performed, for example, by a single placement module 710. Placement module 701 can be, for example, similar to placement software now in common use for the placement of PLD designs. Steps 701 and 702 can be performed sequentially (in any order) or concurrently. In some embodiments, steps 701 and 702 are performed in an interactive fashion, i.e., with the placements of the two blocks being optimized one with the other. Such placement processes are well known to those of skill in the art.

In step 703, two related data input terminals are identified for a programmable routing multiplexer in the PLD. The two data input terminals are related in such a fashion that a selection between the two data input terminals is determined by a value stored in a memory cell controlling the programmable routing multiplexer. Therefore, if the first input terminal is selected, and the value stored in the memory cell is changed by an SEU, the second input terminal is then selected. Similarly, if the second input terminal is selected, and the value stored in the memory cell is changed by an SEU, the first input terminal is then selected.

In step 704, the node from the design is routed between the first and second logic blocks (i.e., between the source logic and the destination logic). The resulting routing path traverses the programmable routing multiplexer via the first data input terminal. In step 705, the node is again routed on a second routing path between the first and second logic blocks. The second routing path traverses the programmable routing multiplexer via the second data input terminal. The first and second routing paths can share some interconnect lines in the path, as shown in FIGS. 3 and 6, or can be independent of one another.

Steps 704 and 705 can be performed sequentially (in any order) or concurrently. In some embodiments, steps 704 and 705 are performed concurrently and in an interactive fashion, i.e., with the two routing paths being optimized one with the other. Such routing processes are well known to those of skill in the art.

In optional steps 706 and 707, a third data input terminal of the routing multiplexer is identified that is also related to the first data input terminal (step 706). The third input terminal is related to the first input terminal in such a fashion that a selection between the two data input terminals is determined by a value stored in a second memory cell controlling the programmable routing multiplexer. The node is then routed a third time, this time traversing the programmable routing multiplexer via the third data input terminal (step 707). Steps 706 and 707 can be repeated as desired to add additional duplicate wires, e.g., for larger multiplexers controlled by larger numbers of memory cells. Additionally or alternatively, large multiplexers can be treated as cascades of smaller multiplexers, with the SEU mitigation techniques of the invention being applied individually to the smaller multiplexers.

Steps 703–705 or 703–707 can be performed, for example, by a single routing module 711. The illustrated routing module 711 can be readily adapted from current routing software to perform the illustrative steps shown in FIG. 7.

In some embodiments, the PLD is a field programmable gate array (FPGA), and in some of these embodiments the memory cells are static RAM-based configuration memory cells of the FPGA. However, the methods of the invention (e.g., the methods illustrated in FIGS. 7–9) can be applied to any PLD that includes memory cells subject to single event upsets resulting from any cause.

Figure 8:
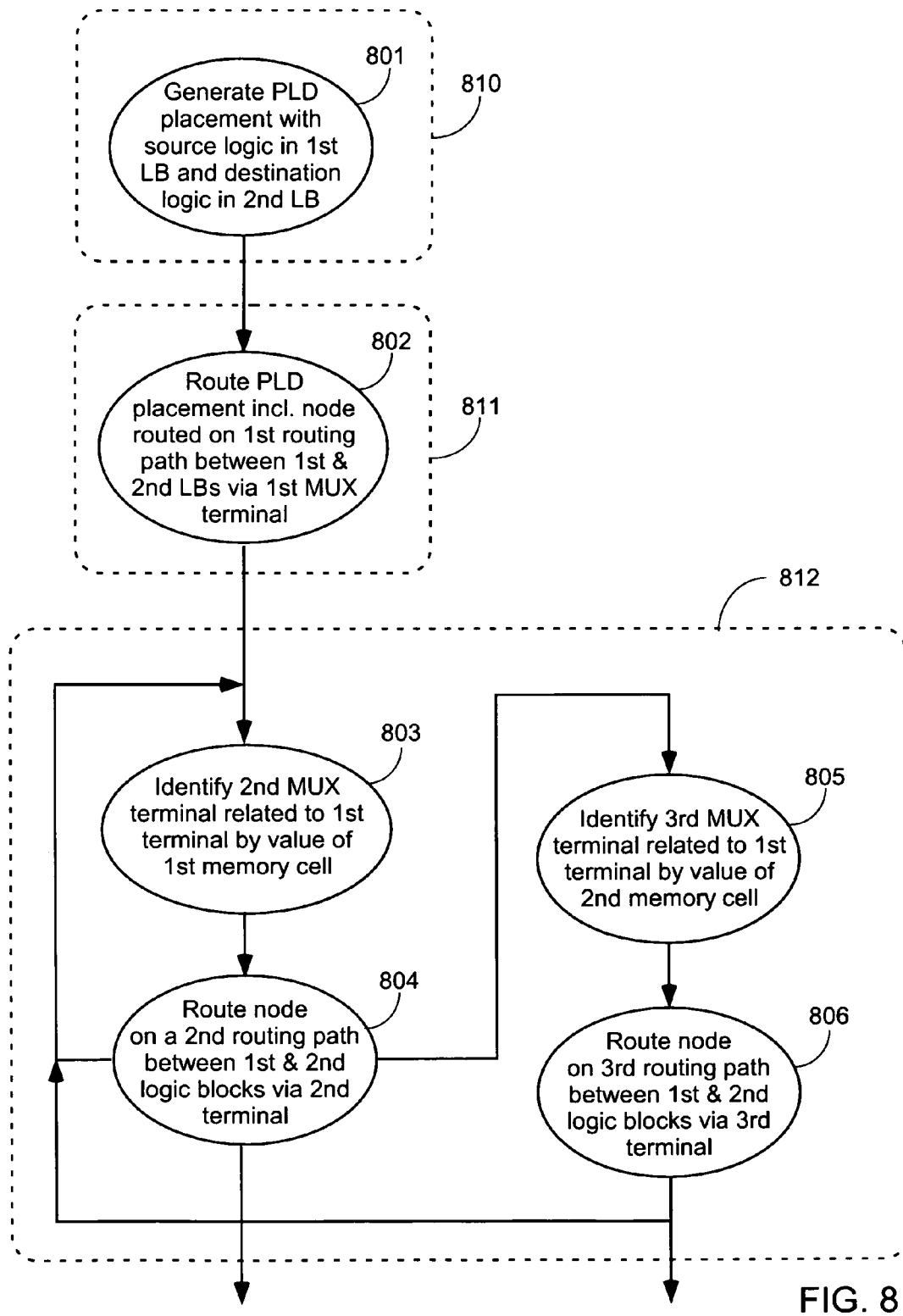
FIG. 8 shows the steps of a second method of implementing a design in a PLD to reduce susceptibility to SEUS, utilizing duplicate paths through a routing multiplexer.

FIG. 8 shows the steps of a second method of implementing a design in a PLD to reduce susceptibility to SEUS, utilizing duplicate paths through a routing multiplexer. This method can be enabled, for example, by providing a post-processing module in addition to existing PLD software. The post-processing module modifies a previously placed and routed design to add the additional path or paths of the invention. The design includes source logic, destination logic, and a node coupled between the source logic and the destination logic.

In step 801, a PLD placement of the design is generated, with the source logic assigned to a first logic block and the destination logic assigned to a second logic block. This step can be performed by a placement module 810. Placement module 810 can be, for example, placement software such as is already well known and readily available.

In step 802, the PLD placement is routed to generate a routed design. In the routed design, the PLD node is routed on a first routing path that traverses a programmable routing multiplexer via a first data input terminal. Step 802 can be performed by a routing module 811. Routing module 811 can be, for example, routing software such as is already well known and readily available.

In step 803, a second data input terminal of the routing multiplexer is identified that is related to the first data input terminal. The two data input terminals are related in such a fashion that a selection between the two data input terminals is determined by a value stored in a memory cell controlling the programmable routing multiplexer. Therefore, if the first input terminal is selected, and the value stored in the memory cell is changed by an SEU, the second input terminal is then selected. Similarly, if the second input terminal is selected, and the value stored in the memory cell is changed by an SEU, the first input terminal is then selected.

In step 804, the PLD node is routed on a second routing path between the first and second logic blocks. The second routing path traverses the programmable routing multiplexer via the second data input terminal.

Note that in some embodiments, and depending on the number and type of PLD interconnect resources left unused by the design, it might not be possible to route many (or any) of the nodes using a second routing path. In some embodiments, the routing software performing step 804 is enabled to alter the routing previously implemented in step 802 to permit the addition of a second routing path. In some embodiments, if the routing software is unable to add a second path, the software simply moves on and makes the attempt on another node. In some embodiments, the software generates a report of nodes to which a second path could not be added, or a report of nodes to which a second path was successfully added.

In optional steps 805 and 806, a third data input terminal of the routing multiplexer is identified that is also related to the first data input terminal (step 805). The third input terminal is related to the first input terminal in such a fashion that a selection between the two data input terminals is determined by a value stored in a second memory cell controlling the programmable routing multiplexer. The node is then routed a third time, this time traversing the programmable routing multiplexer via the third data input terminal (step 806).

Steps 803–804 or 803–806 can be performed, for example, by a single post-processing module 812.

Figure 9:
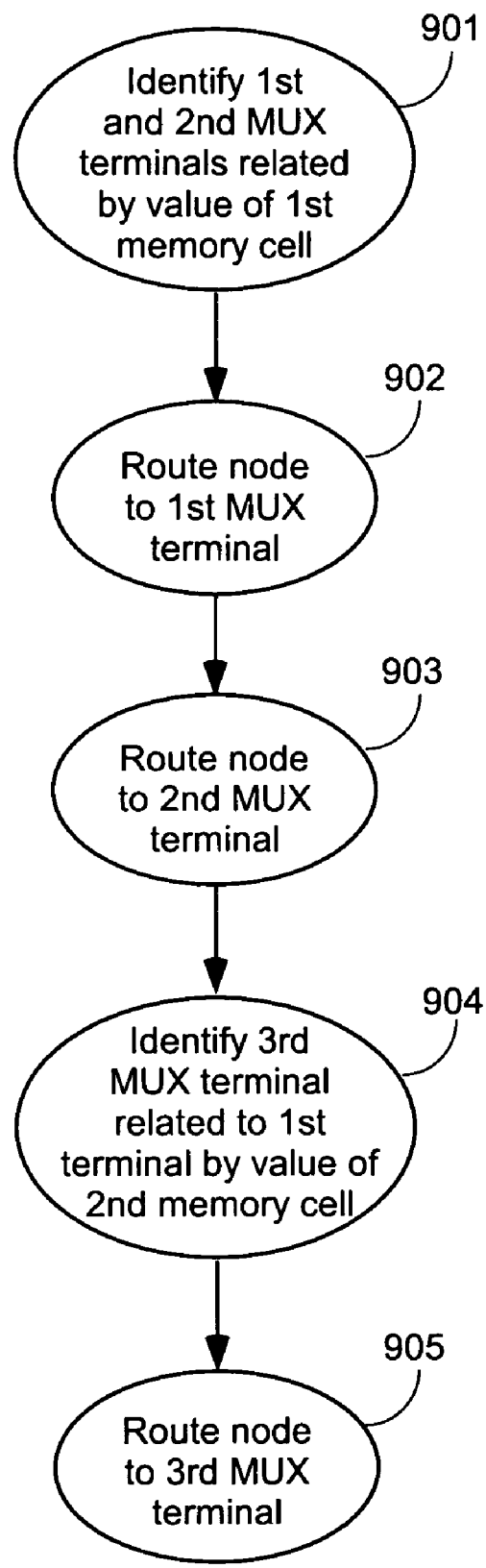
FIG. 9 shows the steps of a third method of implementing a design in a PLD to reduce susceptibility to SEUS, utilizing duplicate paths through a routing multiplexer.

FIG. 9 shows the steps of a third method of implementing a design in a PLD to reduce susceptibility to SEUs, utilizing duplicate paths through a routing multiplexer. In step 901, first and second data input terminals are identified in a programmable routing multiplexer of the PLD. The two data input terminals are related in such a fashion that a selection between the two data input terminals is determined by a value stored in a memory cell controlling the programmable routing multiplexer.

In step 902, a node in the PLD design is routed to the first data input terminal. In step 903, the node is routed to the second data input terminal. Steps 902 and 903 can be performed sequentially (in any order) or concurrently. In some embodiments, steps 902 and 903 are performed concurrently and in an interactive fashion, i.e., with the two routing paths being optimized one with the other. Such routing processes are well known to those of skill in the art.

Step 901 can be performed, for example, by an identification module. Steps 902 and 903 can be performed, for example, by a routing module. In some embodiments, the identification module is a subset of the routing module, or is under the control of the routing module.

In optional steps 904 and 905, a third data input terminal of the routing multiplexer is identified that is also related to the first data input terminal (step 904). The third input terminal is related to the first input terminal in such a fashion that a selection between the two data input terminals is determined by a value stored in a second memory cell controlling the programmable routing multiplexer. The node is then routed a third time, this time traversing the programmable routing multiplexer via the third data input terminal (step 905).

According to some embodiments of the invention, the reduced susceptibility measures described herein are applied only under certain circumstances, e.g., when the circuit being implemented is not already included in a triple modular redundancy (TMR) circuit. As previously described, one method of protecting against SEUs is to implement the circuit three times, and to allow any two of the modules to override the third module. Therefore, any module affected by an SEU is "outvoted" by the other two modules. When logic and/or circuit nodes are included in a TMR circuit, it is not usually considered necessary to apply other measures against SEUS. Therefore, for example, logic and/or nodes included in a circuit can be tested to determine if they form a portion of a TMR circuit, and the steps shown in FIGS. 7–9 (for example) can be applied only in the absence of TMR.

According to other embodiments of the invention, the reduced susceptibility measures described herein are applied only when the circuit being implemented is not already covered by other fault tolerance schemes. For example, any circuit, node, or logic can be exempted from the reduced susceptibility measures of the present invention when the circuit, node, or logic forms a portion of any logic voting scheme, e.g., three out of five. Other known methods of increasing fault tolerance can also be detected, and the methods of the invention can be applied only when these other known methods have not been previously applied.

Figure 10:
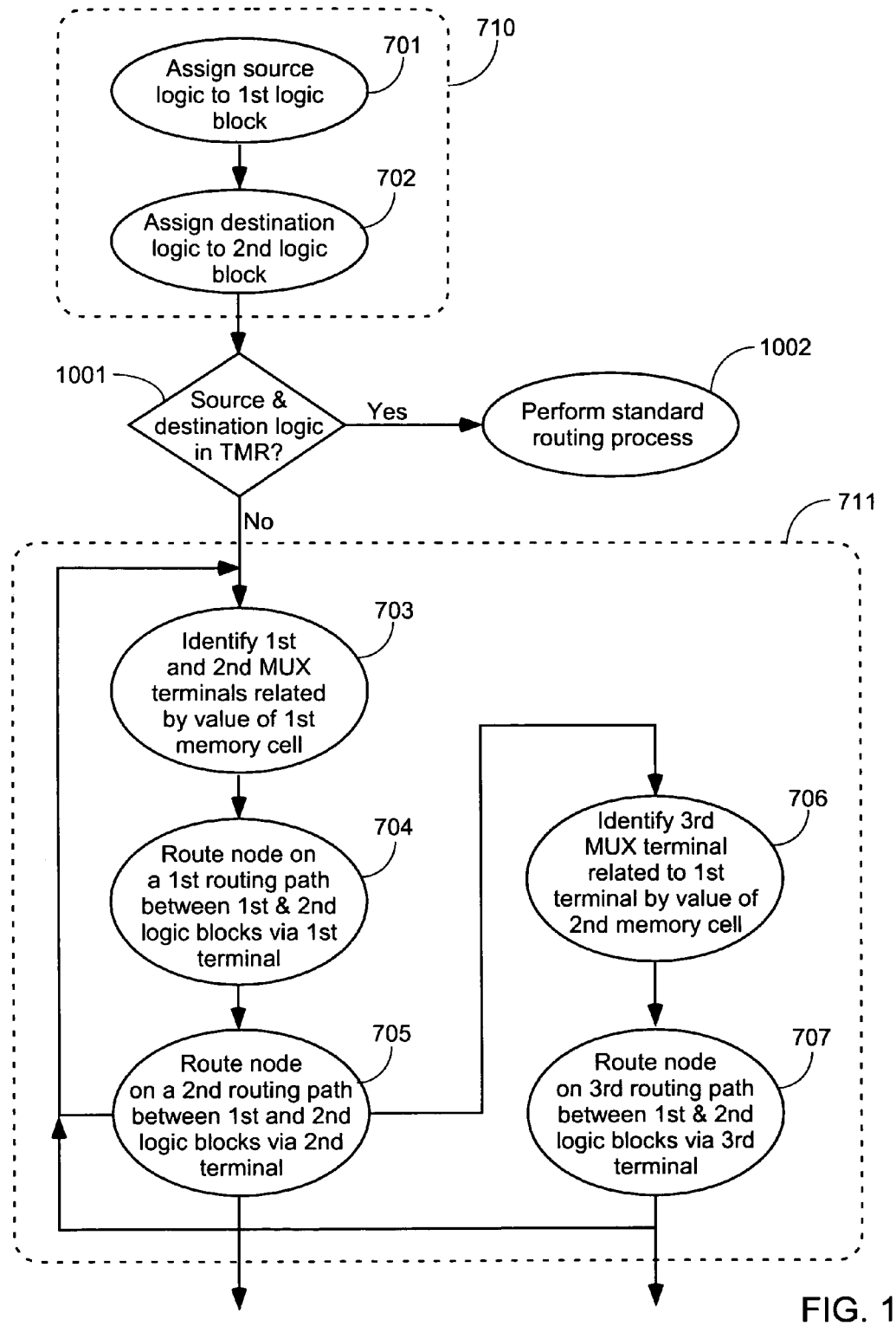
FIG. 10 shows the steps of a fourth method of implementing a design in a PLD to reduce susceptibility to SEUS, utilizing duplicate paths through a routing multiplexer.

FIG. 10 shows the steps of one such method of implementing a design in a PLD to reduce susceptibility to SEUS. Many of the steps shown in FIG. 10 are similar to steps shown in FIG. 7. However, in added step 1001 the source and destination logic assigned in steps 701 and 702 are evaluated to determine if they each form a portion of a TMR circuit. If so, standard routing processes are used to route the node between the source and destination logic (step 1002). If not, the SEU mitigating steps 703–707 are performed. Note that step 1001 can be performed prior to either or both of steps 701 and 702, if desired.

Figure 11:
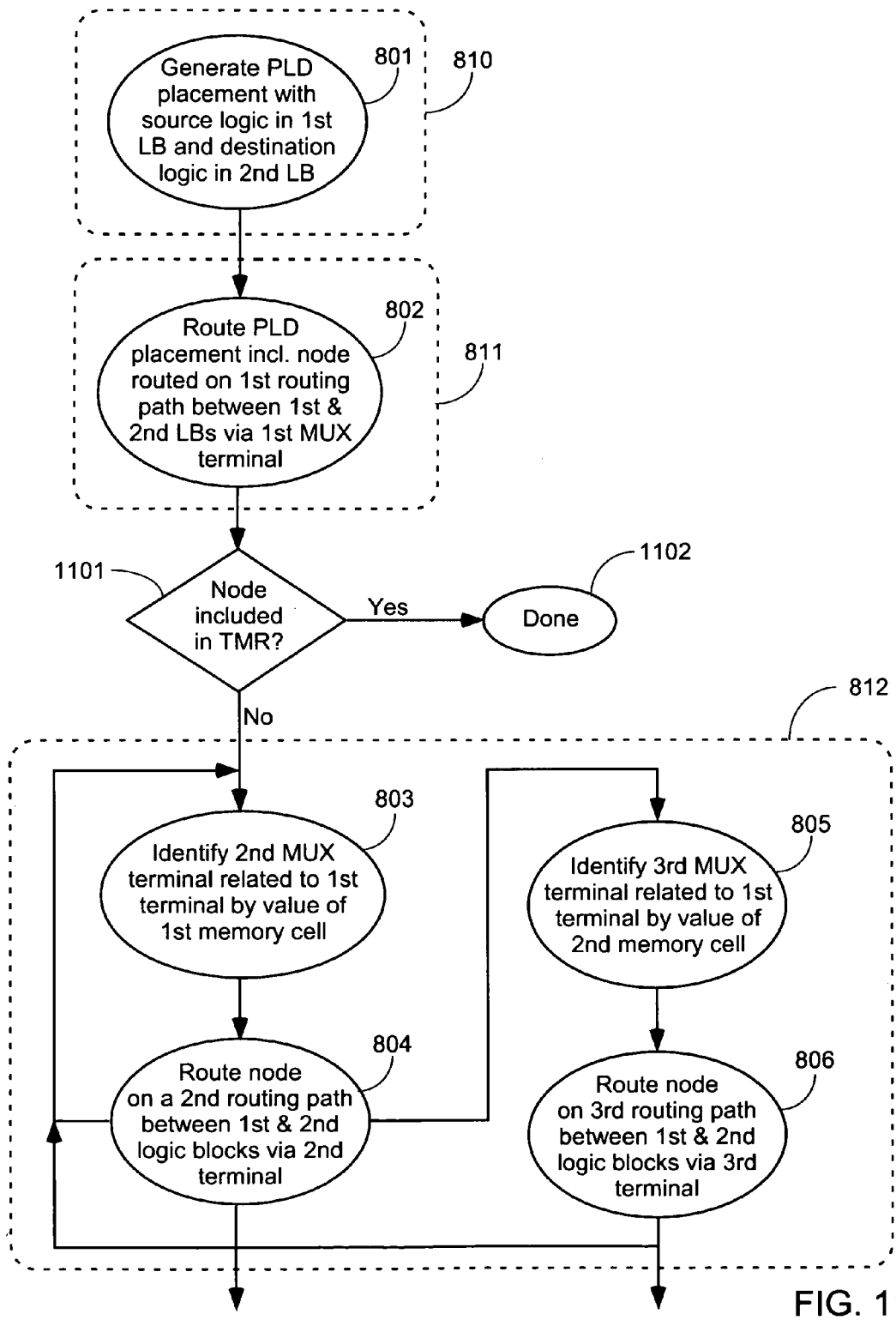
FIG. 11 shows the steps of a fifth method of implementing a design in a PLD to reduce susceptibility to SEUs, utilizing duplicate paths through a routing multiplexer.

FIG. 11 shows the steps of another such method. Many of the steps shown in FIG. 11 are similar to steps shown in FIG. 8. However, in added step 1101 the node routed in step 802 is evaluated to determine if the node is included in a TMR circuit. If so, the routing process is complete (step 1102). If not, the SEU mitigating steps 803–806 are performed. Note that step 1101 can be performed prior to either or both of steps 801 and 802, if desired.

Figure 12:
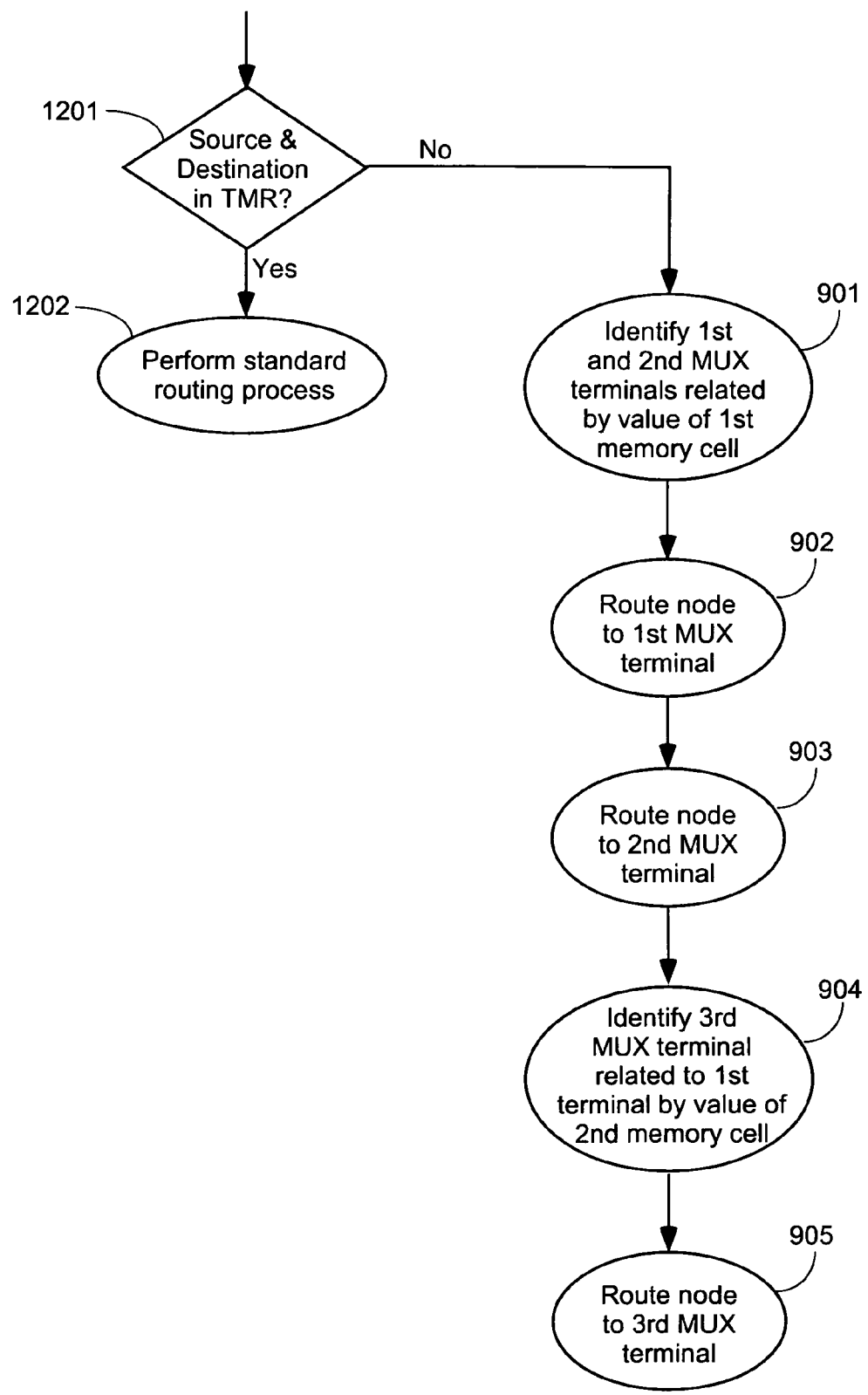
FIG. 12 shows the steps of a sixth method of implementing a design in a PLD to reduce susceptibility to SEUs, utilizing duplicate paths through a routing multiplexer.

FIG. 12 shows the steps of another such method. Many of the steps shown in FIG. 12 are similar to steps shown in FIG. 9. However, in added step 1201 a node in the PLD design is evaluated to determine if the node is included in a TMR circuit. If so, standard routing processes are used to route the node (step 1202). If not, the SEU mitigating steps 901–905 are performed.

FIGS. 13–17 illustrate some embodiments of the invention in which designs are implemented in simple FPGAs. However, the illustrated embodiments can also be implemented in other PLDS, including more complex FPGAs and PLDs other than FPGAs.

Figure 13:
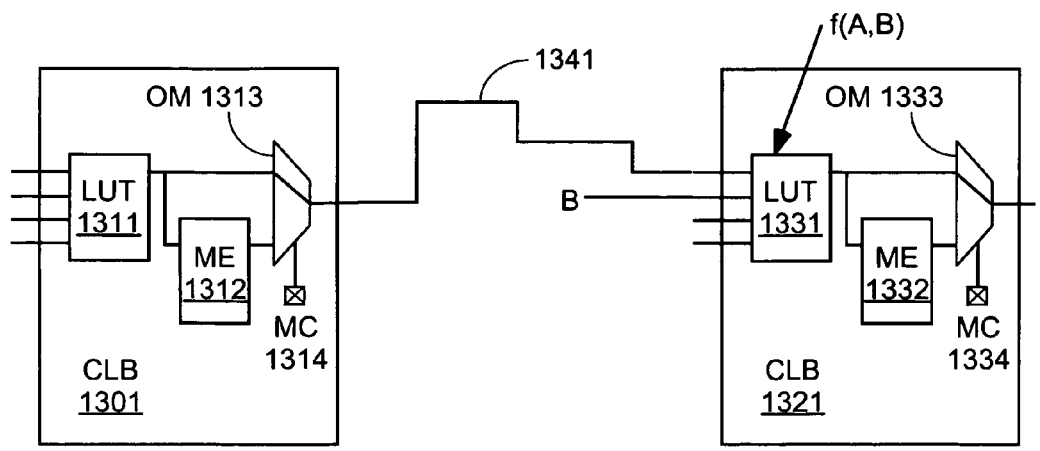
FIG. 13 shows the source logic and destination logic for a node in a PLD design, and a single routing path interconnecting the source and destination logic.

FIG. 13 shows the source logic and destination logic for a node in a prior art PLD design. The source and destination logic are interconnected via a single routing path. The source logic is implemented in a configurable logic block (CLB) 1301. The CLB includes a look-up table (LUT) 1311, a memory element (ME) 1312 having a data input terminal coupled to the output from the LUT, and an output multiplexer (OM) 1313 selecting between the outputs of the LUT and the memory element. The output multiplexer is controlled by a configuration memory cell (MC) 1314. In some embodiments, the configuration memory cell is a static RAM cell. The destination logic is implemented in a similar CLB that includes LUT 1331, memory element 1332, output multiplexer 1333, and configuration memory cell 1334.

In the illustrated embodiment, output multiplexers 1313 and 1333 are both configured to provide the output signal from the associated LUT as the output of the CLB. The output signal from CLB 1301 is provided via a single routing path 1341 to one of the inputs to LUT 1331. The destination logic implemented in LUT 1331 is also driven by a second input B from another source (not shown). LUT 1331 implements a function f(A,B), where A is the signal on routing path 1341.

Figure 14:
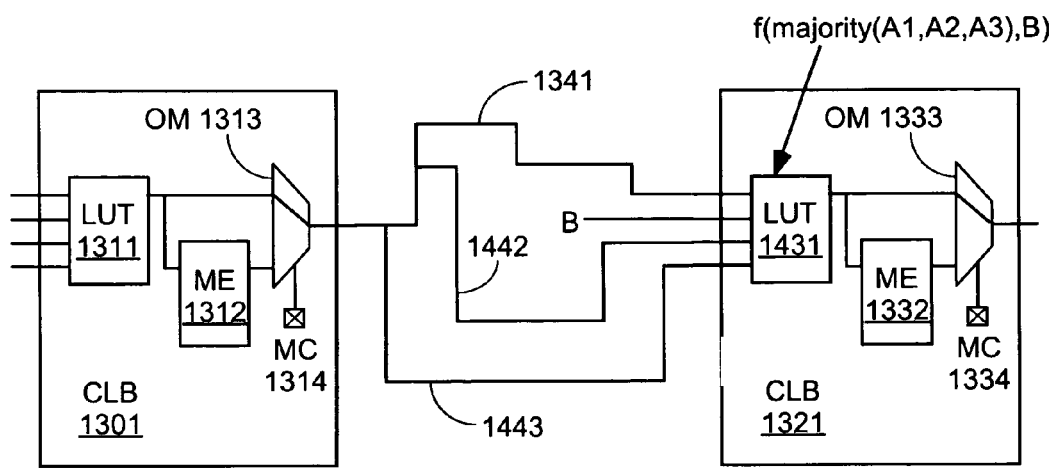
FIG. 14 shows the source logic and destination logic for a node in a PLD design, the destination logic being implemented using TMR in an FPGA look-up table (LUT), and the three duplicate paths interconnecting the source and destination logic.

FIG. 14 shows the same design, but implemented according to an embodiment of the invention. Instead of a single routing path between the source and destination, three routing paths 1341, 1442, and 1443 are provided. All three paths begin at the output terminal of CLB 1301. Each path terminates at a different input terminal of LUT 1431 in CLB 1321. In the pictured embodiment, LUT 1431 is a standard 4-input look-up table that can provide any function of up to four inputs. Therefore, LUT 1431 can implement a triple modular redundancy (TMR) function of the three duplicate paths 1341, 1442, and 1443, and also implement the 2-input function originally implemented in LUT 1331 (see FIG. 13). LUT 1431 implements the function f(majority(A1,A2,A3), B), where f( ) is the function implemented by LUT 1331 (see FIG. 13) and A1,A2,A3 are the signals on routing paths 1341, 1442, and 1443.

Note that the modification shown in FIG. 14 carries a speed penalty due to the additional capacitance on the output from CLB 1301. Therefore, in some embodiments this modification is used only for nodes having non-critical path delays.

In some embodiments, designs are deliberately tailored (e.g., by logic synthesis tools) such that the destination logic of SEU-critical nets has two fewer input signals than the available LUTS. Thus, two extra input terminals are available for duplicate routing paths of one of the input signals. For example, in a design targeted to a PLD having 4-input LUTs, the destination logic is deliberately tailored to have only two input signals. Thus, the SEU-critical nets are made suitable for the application of the technique demonstrated in FIG. 14. A similar approach can be applied to other circuits used to implement the destination logic, e.g., product term logic in CPLDs.

Figure 15:
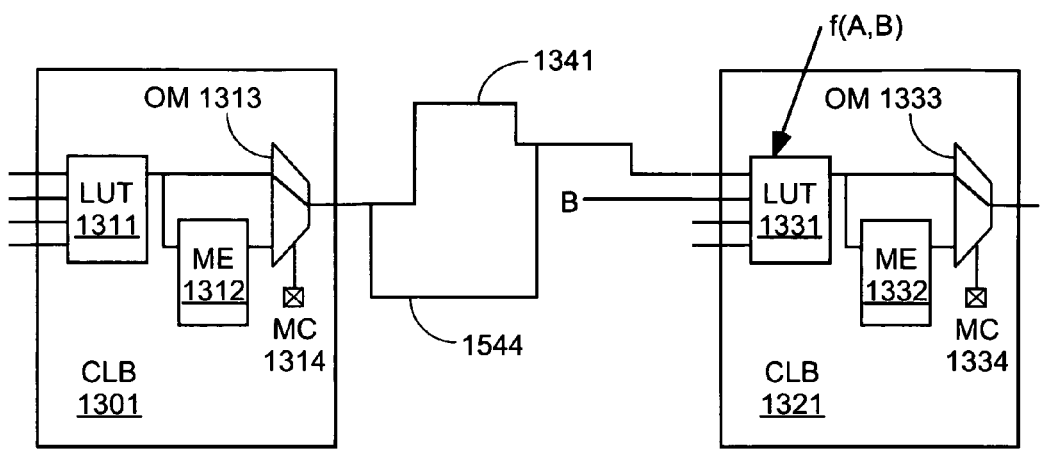
FIG. 15 shows a portion of an FPGA design that implements a node using two duplicate paths implemented in the interconnect structure of the FPGA.

FIG. 15 also shows the same design as in FIG. 13, but implemented according to another embodiment of the invention. Instead of a single routing path between the source and the destination, at least a portion of routing path 1341 is duplicated (routing path 1544). Note that an undesirable situation can occur if one or both of the duplicate paths include drivers (e.g., buffers), and a memory cell on the duplicated portion is subjected to an SEU. In this situation, the two duplicate paths can supply two different voltage levels to the destination logic, causing contention on the input node. Therefore, this embodiment is preferably used only when the duplicated paths do not traverse driver circuits, e.g., when programmable interconnect points (PIPs) on the routing paths are implemented as pass transistors. Or, to put it another way, the embodiment of FIG. 15 is preferably applied only to portions of a net between the last driver on the net and the destination logic for the net.

Note that the modification shown in FIG. 15 also carries a speed penalty due to the additional capacitance on the output from CLB 1301. Therefore, in some embodiments this modification is used only for nodes having non-critical path delays.

Figure 16:
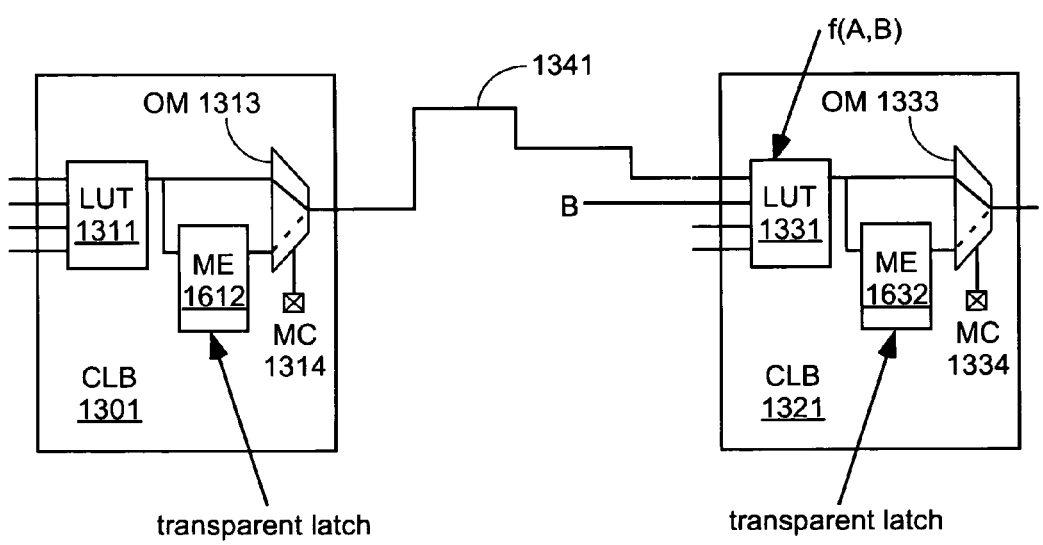
FIG. 16 shows a portion of an FPGA design that implements a node using two duplicate paths, one of which traverses a transparent latch and one of which bypasses the transparent latch.

FIG. 16 also shows the same design as in FIG. 13, but implemented according to yet another embodiment of the invention. The routing path between the source and the destination remains a single routing path as in FIG. 13. However, a duplicate routing path is provided within each CLB. In the pictured embodiment, each of the CLBs is modified to include the duplicate path. In other embodiments (not shown), only one or the other of the source and destination CLBs is modified. Each of memory elements 1612 and 1632 is configured as a transparent latch. This feature is available in many FPGAs, e.g., the Virtex™ family of FPGAs from Xilinx, Inc., in which the programmable memory elements can be configured as either transparent latches or flip-flops of various types. Output multiplexers 1314 and 1334 now select between two logically identical input signals, and the values stored in memory cells 1314 and 1334 are don't-care values. Thus, these memory cells are immune to SEUs.

In the pictured embodiment, output multiplexers 1313 and 1333 have only two input signals. Therefore, each of these multiplexers is controlled by a single configuration memory cell having a don't-care value. In other embodiments, the output multiplexers have a larger number of input signals. In these embodiments, the two multiplexer input terminals driven by the LUT and the memory element are selected such that an SEU affecting the memory cell controlling the multiplexer simply switches the selection from one to the other of the two input terminals.

Figure 17:
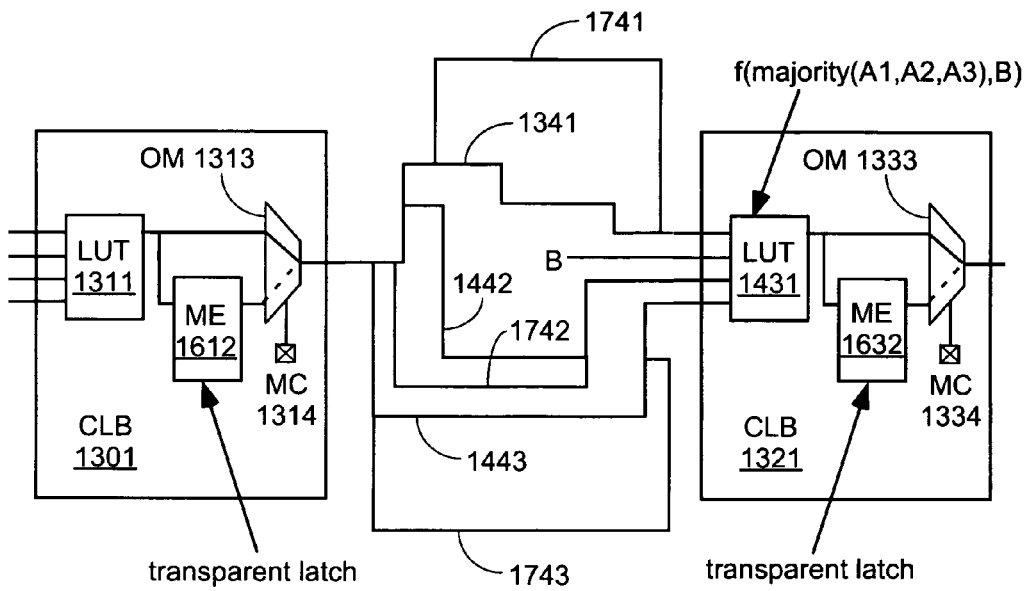
FIG. 17 shows a portion of an FPGA design that implements a node by combining several of the techniques illustrated in the other figures.

FIG. 17 also shows the same design as in FIG. 13, but includes all of the various modifications shown in FIGS. 14–16. Three routing paths 1341, 1442, and 1443 are provided between the source and destination, with each routing path terminating at a different input terminal of LUT 1431. LUT 1431 is configured to implement a TMR function of the signals on the three input terminals. Each of routing paths 1341, 1442, and 1443 is also duplicated (by paths 1741, 1742, and 1743, respectively). Additionally, each of CLBs 1301 and 1321 is configured to provide duplicate paths both traversing and bypassing memory elements 1612 and 1632, respectively, which are configured as transparent latches. Note that the methods illustrated in FIGS. 7–12 can also be applied to structures similar to those illustrated in FIGS. 14–17.

Figure 18:
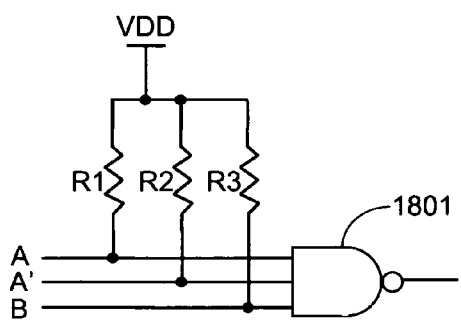
FIG. 18 shows how a PLD design can use weak pull-ups to provide another way in which duplicate routing paths can reduce the effects of SEUs.

FIG. 18 shows how a PLD design can use weak pull-ups to provide another way in which duplicate routing paths can reduce the effects of SEUs. Some SEUs will cause an "open" in a routing path. This situation can occur, for example, when a pass transistor on the routing path is controlled by a memory cell, and the value stored in the memory cell is inadvertently changed from "one" to "zero" as a result of an SEU. When the routing path terminates at an AND gate or a NAND gate (or equivalent logic, e.g., a similar function implemented in a LUT), a high value will be ignored by the destination logic. Thus, the signal can be routed on two routing paths (A and A' in FIG. 18, for example), with a weak pull-up (e.g., resistors R1–R3) attached to each input terminal of the AND or NAND gate (e.g., NAND-gate 1801 in FIG. 18). If an SEU causes an "open" on either of the two routing paths A, A', the corresponding NAND-gate input terminal is pulled high by the corresponding weak pull-up and is ignored by the NAND gate. The pull-up R3 on routing path B is optional, but might be included simply to provide more routing options for routing paths A and A'. The approach illustrated in FIG. 18 is particularly useful, for example, for PLDs that include a large number of NAND gates interconnected by programmable interconnect.

Figure 19:
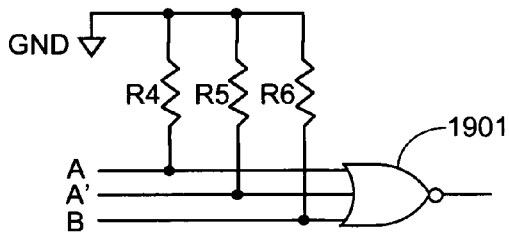
FIG. 19 shows how a PLD design can use weak pull-downs to provide another way in which duplicate routing paths can reduce the effects of SEUs.

FIG. 19 illustrates how a similar approach can be used with OR and NOR gates, by applying weak pull-downs (e.g., resistors R4–R6) to the input terminals of the gate (NOR gate 1901). The pull-down R6 on routing path B is optional, but might be included simply to provide more routing options for routing paths A and A'. The approach illustrated in FIG. 19 is particularly useful, for example, for PLDs that include a large number of NOR gates interconnected by programmable interconnect.

The methods of the present invention can be performed in either hardware, software, or any combination thereof, as those terms are currently known in the art. In particular, the present methods can be carried out by software, firmware, or microcode operating on a computer or computers of any type. Additionally, software embodying the present invention can comprise computer instructions in any form (e.g., source code, object code, interpreted code, etc.) stored in any computer-readable medium (e.g., ROM, RAM, magnetic media, punched tape or card, compact disc (CD) in any form, DVD, etc.). Further, such software can also be in the form of a computer data signal embodied in a carrier wave, such as that found within the well-known Web pages transferred among computers connected to the Internet. Accordingly, the present invention is not limited to any particular platform, unless specifically stated otherwise in the present disclosure.

Those having skill in the relevant arts of the invention will now perceive various modifications and additions that can be made as a result of the disclosure herein. Accordingly, all such modifications and additions are deemed to be within the scope of the invention, which is to be limited only by the appended claims and their equivalents.

What is claimed is:

1. A method of implementing a design in a programmable logic device (PLD) to reduce susceptibility to single-event upsets (SEUs), the method comprising:
   generating an unrouted logic placement for the design;
   routing the unrouted logic placement to produce a routed design; and
   modifying the routed design to reduce susceptibility of the design to the SEUs.

2. The method of claim 1, wherein the PLD is a field programmable gate array (FPGA).

3. The method of claim 1, wherein the design comprises source logic, destination logic, and a node coupled between the source logic and the destination logic, and wherein modifying the routed design comprises providing duplicate routing paths for the node.

4. The method of claim 3, wherein the duplicate routing paths traverse a programmable routing multiplexer in the PLD, and wherein an SEU affecting input selection for the programmable routing multiplexer changes the input selection from one to another of the duplicate routing paths.

5. The method of claim 4, wherein:
generating an unrouted logic placement for the design comprises assigning the source logic to a first logic block in the PLD and assigning the destination logic to a second logic block in the PLD; and
modifying the routed design comprises:
identifying first and second data input terminals of a programmable routing multiplexer in the PLD, wherein a selection between the first and second data input terminals is determined by a value stored in a memory cell controlling the programmable routing multiplexer;
routing the node on a first routing path between the first and second logic blocks, wherein the first routing path traverses the programmable routing multiplexer via the first data input terminal; and
routing the node on a second routing path between the first and second logic blocks, wherein the second routing path traverses the programmable routing multiplexer via the second data input terminal.

6. The method of claim 5, wherein the PLD is a field programmable gate array (FPGA), and wherein the memory cell is a static RAM-based configuration memory cell of the FPGA.

7. The method of claim 3, further comprising:
evaluating the source and destination logic and determining that the source and destination logic do not form a portion of a triple modular redundancy (TMR) circuit.

8. The method of claim 3, wherein:
generating an unrouted logic placement for the design comprises implementing the destination logic using triple modular redundancy (TMR); and
providing duplicate routing paths for the node comprises providing three routing paths for the node, each of the three routing paths providing one TMR input signal to the destination logic.

9. The method of claim 8, wherein:
the PLD is a field programmable gate array (FPGA) comprising a look-up table (LUT); and
generating an unrouted logic placement for the design further comprises synthesizing the design to ensure that the destination logic has two fewer input signals than the LUT.

10. The method of claim 8, wherein:
the PLD is a field programmable gate array (FPGA) comprising a look-up table (LUT) having N input terminals, where N is an integer at least equal to four;
the destination logic implements a function having no more than N−2 inputs, of which one input is provided by the node; and
implementing the destination logic using TMR comprises implementing the destination logic in the LUT, three of the input terminals of the LUT being coupled to the three routing paths for the node.

11. The method of claim 3, wherein the duplicate routing paths comprise a first path traversing a transparent latch and a second path bypassing the transparent latch.

12. The method of claim 11, wherein the PLD is a field programmable gate array (FPGA), and wherein the transparent latch comprises a programmable memory element in the FPGA configured as a transparent latch.

13. The method of claim 3, wherein the destination logic comprises a logic gate having a plurality of input terminals each coupled to one of the duplicate routing paths and further coupled to a weak pull-up, the logic gate comprising one of an AND and a NAND gate.

14. The method of claim 3, wherein the destination logic comprises a logic gate having a plurality of input terminals each coupled to one of the duplicate routing paths and further coupled to a weak pull-down, the logic gate comprising one of an OR and a NOR gate.

15. A computer-readable storage medium comprising computer-executable code for implementing a design in a programmable logic device (PLD) to reduce susceptibility to single-event upsets (SEUs), the medium comprising:
code for generating an unrouted logic placement for the design;
code for routing the unrouted logic placement to produce a routed design; and
code for modifying the routed design to reduce susceptibility of the design to the SEUs.

16. The medium of claim 15, wherein the PLD is a field programmable gate array (FPGA).

17. The medium of claim 15, wherein the design comprises source logic, destination logic, and a node coupled between the source logic and the destination logic, and wherein the code for modifying the routed design comprises code for providing duplicate routing paths for the node.

18. The medium of claim 17, wherein the duplicate routing paths traverse a programmable routing multiplexer in the PLD, and wherein an SEU affecting input selection for the programmable routing multiplexer changes the input selection from one to another of the duplicate routing paths.

19. The medium of claim 17, further comprising:
code for evaluating the source and destination logic and determining that the source and destination logic do not form a portion of a triple modular redundancy (TMR) circuit.

20. The medium of claim 17, wherein:
the code for generating an unrouted logic placement for the design comprises code for implementing the destination logic using triple modular redundancy (TMR); and
the code for providing duplicate routing paths for the node comprises code for providing three routing paths for the node, each of the three routing paths providing one TMR input signal to the destination logic.

21. The medium of claim 20, wherein:
the PLD is a field programmable gate array (FPGA) comprising a look-up table (LUT); and
the code for generating an unrouted logic placement for the design further comprises code for synthesizing the design to ensure that the destination logic has two fewer input signals than the LUT.

22. The medium of claim 20, wherein:
the PLD is a field programmable gate array (FPGA) comprising a look-up table (LUT) having N input terminals, where N is an integer at least equal to four;
the destination logic implements a function having no more than N−2 inputs, of which one input is provided by the node; and
the code for implementing the destination logic using TMR comprises code for implementing the destination logic in the LUT, three of the input terminals of the LUT being coupled to the three routing paths for the node.

23. The medium of claim 17, wherein the duplicate routing paths comprise a first path traversing a transparent latch and a second path bypassing the transparent latch.

24. The medium of claim 23, wherein the PLD is a field programmable gate array (FPGA), and the transparent latch comprises a programmable memory element in the FPGA configured as a transparent latch.

25. The medium of claim 17, wherein the destination logic comprises a logic gate having a plurality of input terminals each coupled to one of the duplicate routing paths and further coupled to a weak pull-up, the logic gate comprising one of an AND and a NAND gate.

26. The medium of claim 17, wherein the destination logic comprises a logic gate having a plurality of input terminals each coupled to one of the duplicate routing paths and further coupled to a weak pull-down, the logic gate comprising one of an OR and a NOR gate.

27. A computer system for implementing a design in a programmable logic device (PLD) to reduce susceptibility to single-event upsets (SEUs), the computer system comprising:
a placement module for generating an unrouted logic placement for the design;
a first routing module for routing the unrouted logic placement to produce a routed design; and
a second routing module for modifying the routed design to reduce susceptibility of the design to the SEUS.

28. The computer system of claim 27, wherein the PLD is a field programmable gate array (FPGA).

29. The computer system of claim 27, wherein the design comprises source logic, destination logic, and a node coupled between the source logic and the destination logic, and wherein the second routing module provides duplicate routing paths for the node.

30. A method of implementing a design in a programmable logic device (PLD) to reduce susceptibility to single-event upsets (SEUs), the design comprising source logic, destination logic, and a node coupled between the source logic and the destination logic, the method comprising:
generating an unrouted logic placement for the design; and
routing the unrouted logic placement to produce a routed design including duplicate routing paths for the node.

31. The method of claim 30, wherein the PLD is a field programmable gate array (FPGA).

32. The method of claim 30, wherein the duplicate routing paths traverse a programmable routing multiplexer in the PLD, and wherein an SEU affecting input selection for the programmable routing multiplexer changes the input selection from one to another of the duplicate routing paths.

33. The method of claim 30, wherein:
generating an unrouted logic placement for the design comprises assigning the source logic to a first logic block in the PLD and assigning the destination logic to a second logic block in the PLD; and
routing the unrouted logic placement comprises:
identifying first and second data input terminals of a programmable routing multiplexer in the PLD, wherein a selection between the first and second data input terminals is determined by a value stored in a memory cell controlling the programmable routing multiplexer;
routing the node on a first routing path between the first and second logic blocks, wherein the first routing path traverses the programmable routing multiplexer via the first data input terminal; and
routing the node on a second routing path between the first and second logic blocks, wherein the second routing path traverses the programmable routing multiplexer via the second data input terminal.

34. The method of claim 33, wherein the PLD is a field programmable gate array (FPGA), and wherein the memory cell is a static RAM-based configuration memory cell of the FPGA.

35. The method of claim 30, further comprising:
evaluating the source and destination logic and determining that the source and destination logic do not form a portion of a triple modular redundancy (TMR) circuit.

36. The method of claim 30, wherein:
generating an unrouted logic placement for the design comprises implementing the destination logic using triple modular redundancy (TMR); and
the duplicate routing paths comprise three routing paths for the node, each of the three routing paths providing one TMR input signal to the destination logic.

37. The method of claim 36, wherein:
the PLD is a field programmable gate array (FPGA) comprising a look-up table (LUT); and
generating an unrouted logic placement for the design further comprises synthesizing the design to ensure that the destination logic has two fewer input signals than the LUT.

38. The method of claim 36, wherein:
the PLD is a field programmable gate array (FPGA) comprising a look-up table (LUT) having N input terminals, where N is an integer at least equal to four;
the destination logic implements a function having no more than N−2 inputs, of which one input is provided by the node; and
implementing the destination logic using TMR comprises implementing the destination logic in the LUT, three of the input terminals of the LUT being coupled to the three routing paths for the node.

39. The method of claim 30, wherein the duplicate routing paths comprise a first path traversing a transparent latch and a second path bypassing the transparent latch.

40. The method of claim 39, wherein the PLD is a field programmable gate array (FPGA), and wherein the transparent latch comprises a programmable memory element in the FPGA configured as a transparent latch.

41. The method of claim 30, wherein routing the unrouted logic placement comprises:
selecting input terminals of the multiplexer to maximize a number of duplicate paths differing by a single select bit; and
routing the duplicate paths through the selected input terminals of the multiplexer.

42. The method of claim 30, wherein the destination logic comprises a logic gate having a plurality of input terminals each coupled to one of the duplicate routing paths and further coupled to a weak pull-up, the logic gate comprising one of an AND and a NAND gate.

43. The method of claim 30, wherein the destination logic comprises a logic gate having a plurality of input terminals each coupled to one of the duplicate routing paths and further coupled to a weak pull-down, the logic gate comprising one of an OR and a NOR gate.

44. A computer-readable storage medium comprising computer-executable code for implementing a design in a programmable logic device (PLD) to reduce susceptibility to single-event upsets (SEUs), the medium comprising:

code for generating an unrouted logic placement for the design; and code for routing the unrouted logic placement to produce a routed design including duplicate routing paths for the node.

45. The medium of claim 44, wherein the PLD is a field programmable gate array (FPGA).

46. The medium of claim 44, wherein the duplicate routing paths traverse a programmable routing multiplexer in the PLD, and wherein an SEU affecting input selection for the programmable routing multiplexer changes the input selection from one to another of the duplicate routing paths.

47. The medium of claim 44, further comprising:

code for evaluating the source and destination logic and determining that the source and destination logic do not form a portion of a triple modular redundancy (TMR) circuit.

48. The medium of claim 44, wherein:

the code for generating an unrouted logic placement for the design comprises code for implementing the destination logic using triple modular redundancy (TMR); and the duplicate routing paths comprise three routing paths for the node, each of the three routing paths providing one TMR input signal to the destination logic.

49. The medium of claim 48, wherein:

the PLD is a field programmable gate array (FPGA) comprising a look-up table (LUT); and the code for generating an unrouted logic placement for the design further comprises code for synthesizing the design to ensure that the destination logic has two fewer input signals than the LUT.

50. The medium of claim 48, wherein:

the PLD is a field programmable gate array (FPGA) comprising a look-up table (LUT) having N input terminals, where N is an integer at least equal to four;

the destination logic implements a function having no more than N−2 inputs, of which one input is provided by the node; and the code for implementing the destination logic using TMR comprises code for implementing the destination logic in the LUT, three of the input terminals of the LUT being coupled to the three routing paths for the node.

51. The medium of claim 44, wherein the duplicate routing paths comprise a first path traversing a transparent latch and a second path bypassing the transparent latch.

52. The medium of claim 51, wherein the PLD is a field programmable gate array (FPGA), and wherein the transparent latch comprises a programmable memory element in the FPGA configured as a transparent latch.

53. The medium of claim 44, wherein the code for routing the unrouted logic placement comprises:

code for selecting input terminals of the multiplexer to maximize a number of duplicate paths differing by a single select bit; and code for routing the duplicate paths through the selected input terminals of the multiplexer.

54. The medium of claim 44, wherein the destination logic comprises a logic gate having a plurality of input terminals each coupled to one of the duplicate routing paths and further coupled to a weak pull-up, the logic gate comprising one of an AND and a NAND gate.

55. The medium of claim 44, wherein the destination logic comprises a logic gate having a plurality of input terminals each coupled to one of the duplicate routing paths and further coupled to a weak pull-down, the logic gate comprising one of an OR and a NOR gate.

56. A computer system for implementing a design in a programmable logic device (PLD) to reduce susceptibility to single-event upsets (SEUs), the computer system comprising:

a placement module for generating an unrouted logic placement for the design; and a routing module for routing the unrouted logic placement to produce a routed design including duplicate routing paths for the node.

57. The computer system of claim 56, wherein the PLD is a field programmable gate array (FPGA).

58. A configuration data file implementing in a programmable logic device (PLD) a design having reduced susceptibility to single-event upsets (SEUs), the design comprising source logic, destination logic, and a node coupled between the source logic and the destination logic, the configuration data file comprising:

configuration data assigning the source logic to a first logic block in the PLD;

configuration data assigning the destination logic to a second logic block in the PLD; configuration data implementing the node as a first routing path between the first and second logic blocks; and configuration data implementing the node as a second routing path between the first and second logic blocks.

59. The configuration data file of claim 58, wherein the PLD is a field programmable gate array (FPGA).

60. The configuration data file of claim 58, wherein the first and second routing paths traverse a programmable routing multiplexer in the PLD, and wherein an SEU affecting input selection for the programmable routing multiplexer changes the input selection from one to another of the first and second routing paths.

61. The configuration data file of claim 58, further comprising:

configuration data implementing the destination logic using triple modular redundancy (TMR); and configuration data implementing the node as a third routing path between the first and second logic blocks.

62. The configuration data file of claim 61, wherein:

the PLD is a field programmable gate array (FPGA) comprising a look-up table (LUT) having N input terminals, where N is an integer at least equal to four;

the destination logic implements a function having no more than N−2 inputs, of which one input is provided by the node; and the configuration data implementing the destination logic comprises configuration data implementing the destination logic in the LUT, three of the input terminals of the LUT being coupled to the first, second, and third routing paths.

63. The configuration data file of claim 58, wherein the first routing path traverses a transparent latch and the second path bypasses the transparent latch.

64. The configuration data file of claim 63, wherein the PLD is a field programmable gate array (FPGA), the configuration data file further comprising:

configuration data configuring a programmable memory element in the FPGA as the transparent latch.

* * * * *